United States Patent
Li et al.

(10) Patent No.: US 10,460,982 B1
(45) Date of Patent: Oct. 29, 2019

(54) FORMATION OF SEMICONDUCTOR DEVICES WITH DUAL TRENCH ISOLATIONS

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Choonghyun Lee, Rensselaer, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/008,431

(22) Filed: Jun. 14, 2018

(51) Int. Cl.
| | |
|---|---|
| *H01L 21/76* | (2006.01) |
| *H01L 29/00* | (2006.01) |
| *H01L 21/762* | (2006.01) |
| *H01L 21/8238* | (2006.01) |
| *H01L 27/12* | (2006.01) |
| *H01L 21/84* | (2006.01) |

(52) U.S. Cl.
CPC .. *H01L 21/76229* (2013.01); *H01L 21/76232* (2013.01); *H01L 21/823878* (2013.01); *H01L 21/84* (2013.01); *H01L 27/1203* (2013.01)

(58) Field of Classification Search
CPC ......... H01L 21/76229; H01L 21/76232; H01L 21/823878; H01L 21/84; H01L 27/1203
USPC ................ 438/427, 424; 257/510
See application file for complete search history.

(56) References Cited

U.S. PATENT DOCUMENTS

| | | | |
|---|---|---|---|
| 6,864,152 B1 * | 3/2005 | Mirbedini | ......... H01L 21/76229 257/E21.548 |
| 6,875,697 B2 | 4/2005 | Trivedi | |
| 8,293,615 B2 | 10/2012 | Cheng et al. | |
| 8,399,957 B2 | 3/2013 | Cheng et al. | |
| 8,525,292 B2 | 9/2013 | Cheng et al. | |
| 9,355,887 B2 | 5/2016 | Chan et al. | |
| 9,601,511 B2 | 3/2017 | Vinet et al. | |
| 2005/0009290 A1 * | 1/2005 | Yan | ................... H01L 21/76229 438/424 |
| 2009/0072355 A1 | 3/2009 | Cheng et al. | |
| 2009/0269897 A1 | 10/2009 | Anderson et al. | |

OTHER PUBLICATIONS

L. Grenouillet et al UTBB FDSOI transistors with dual STI for a multi-Vt strategy at 20nm node and below 2012 International Electron Devices Meeting Dec. 10-13, 2012 IEEE.
M. Khater et al FDSOI CMOS with Dielectrically-Isolated Back Gates and 30nm LG High-k/Metal Gate 2010 Symposium on VLSI Technology Digest of Technical Papers Jun. 15-17, 2010 IEEE.

* cited by examiner

*Primary Examiner* — David S Blum
(74) *Attorney, Agent, or Firm* — Tutunjian & Bitetto, P.C.; Vazken Alexanian

(57) ABSTRACT

A method for fabricating a semiconductor device with dual trench isolations includes forming a deep trench located between a first region associated with a first array of transistors and a second region associated with a second array of transistors, forming a first shallow trench located between transistors of the first array and a second shallow trench located between transistors of the second array, and forming, by a single dielectric material fill process, a deep trench isolation (DTI) region in the deep trench, a first shallow trench isolation (STI) region in the first shallow trench, and a second STI region in the second shallow trench.

20 Claims, 7 Drawing Sheets

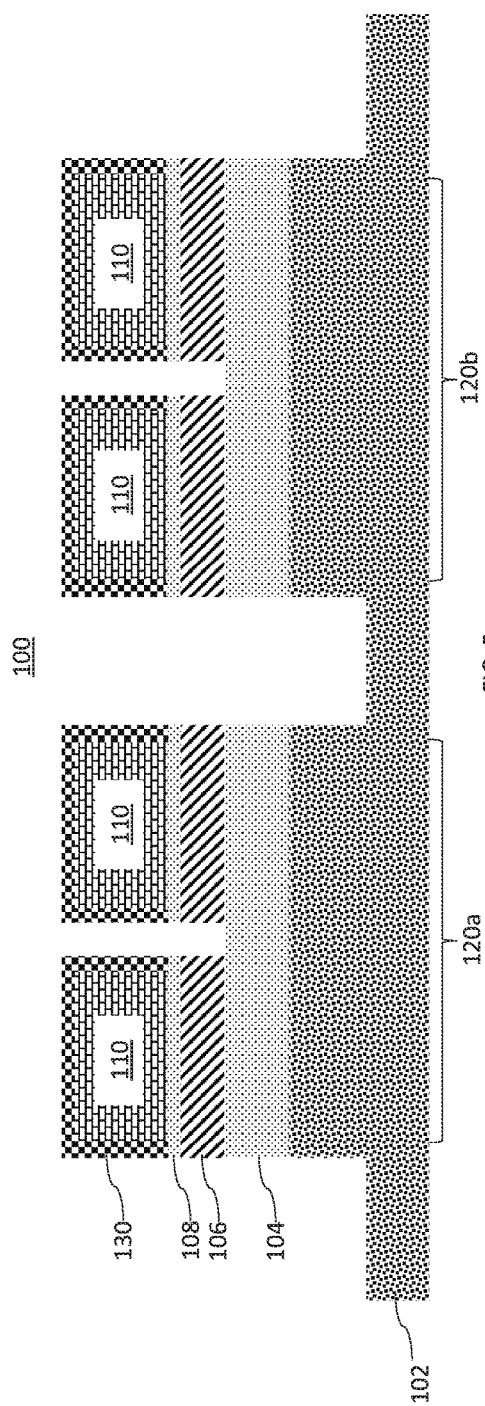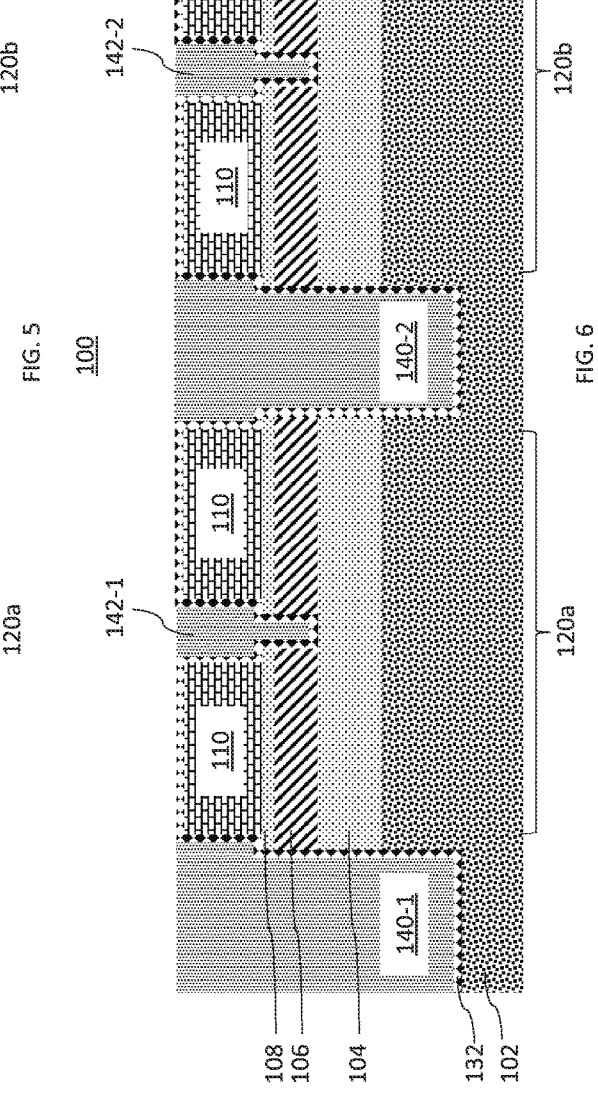
FIG. 5
FIG. 6

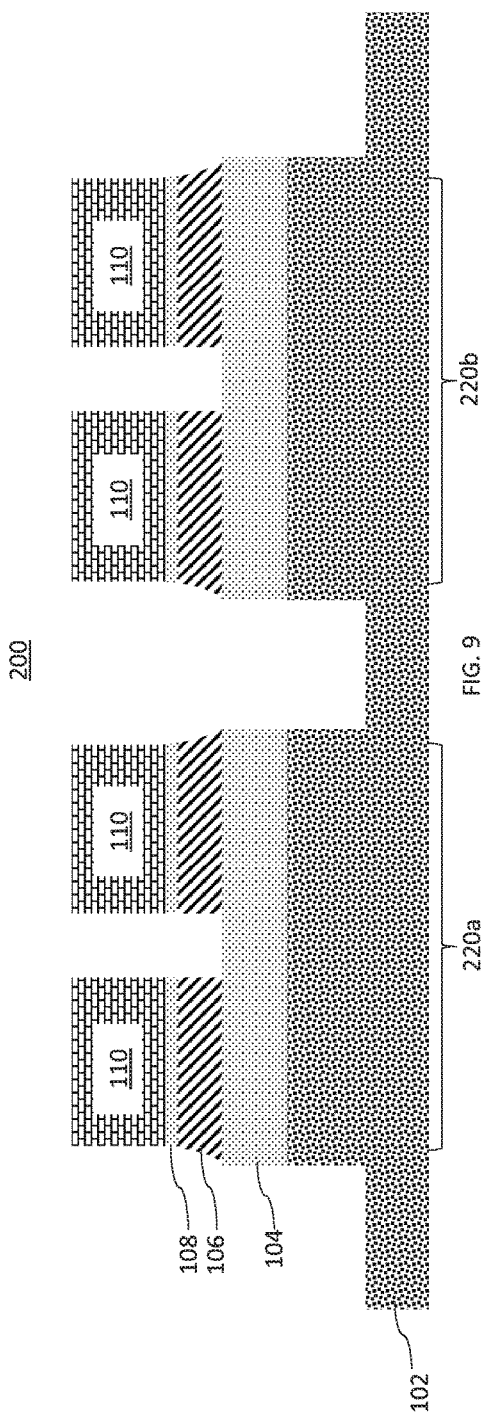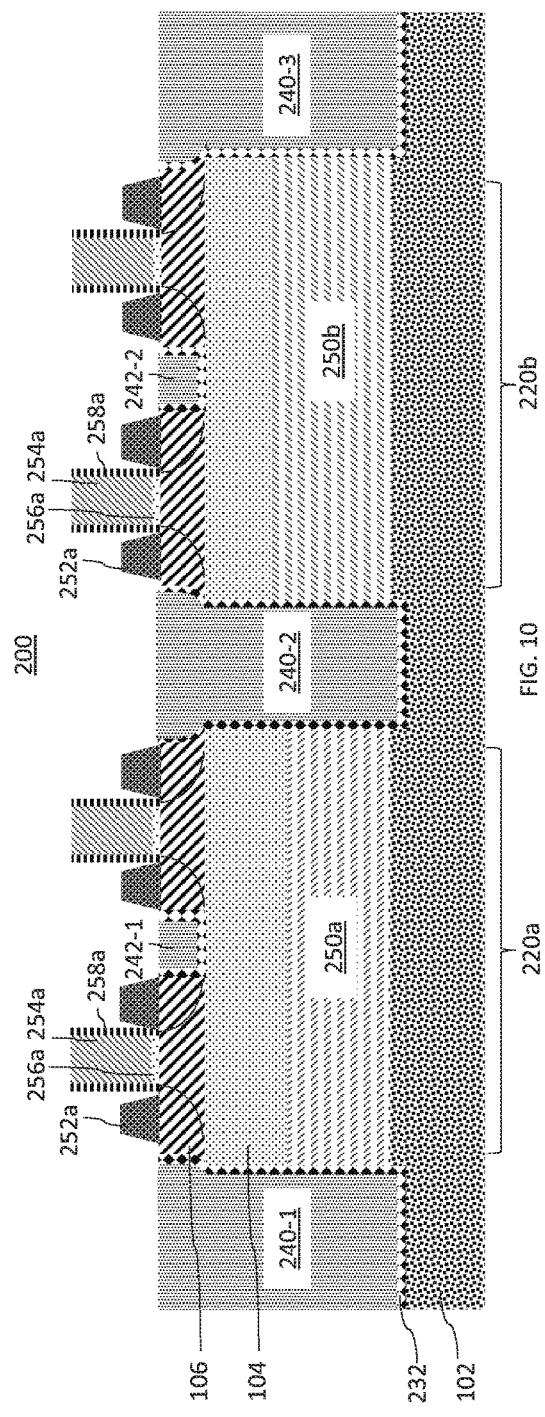

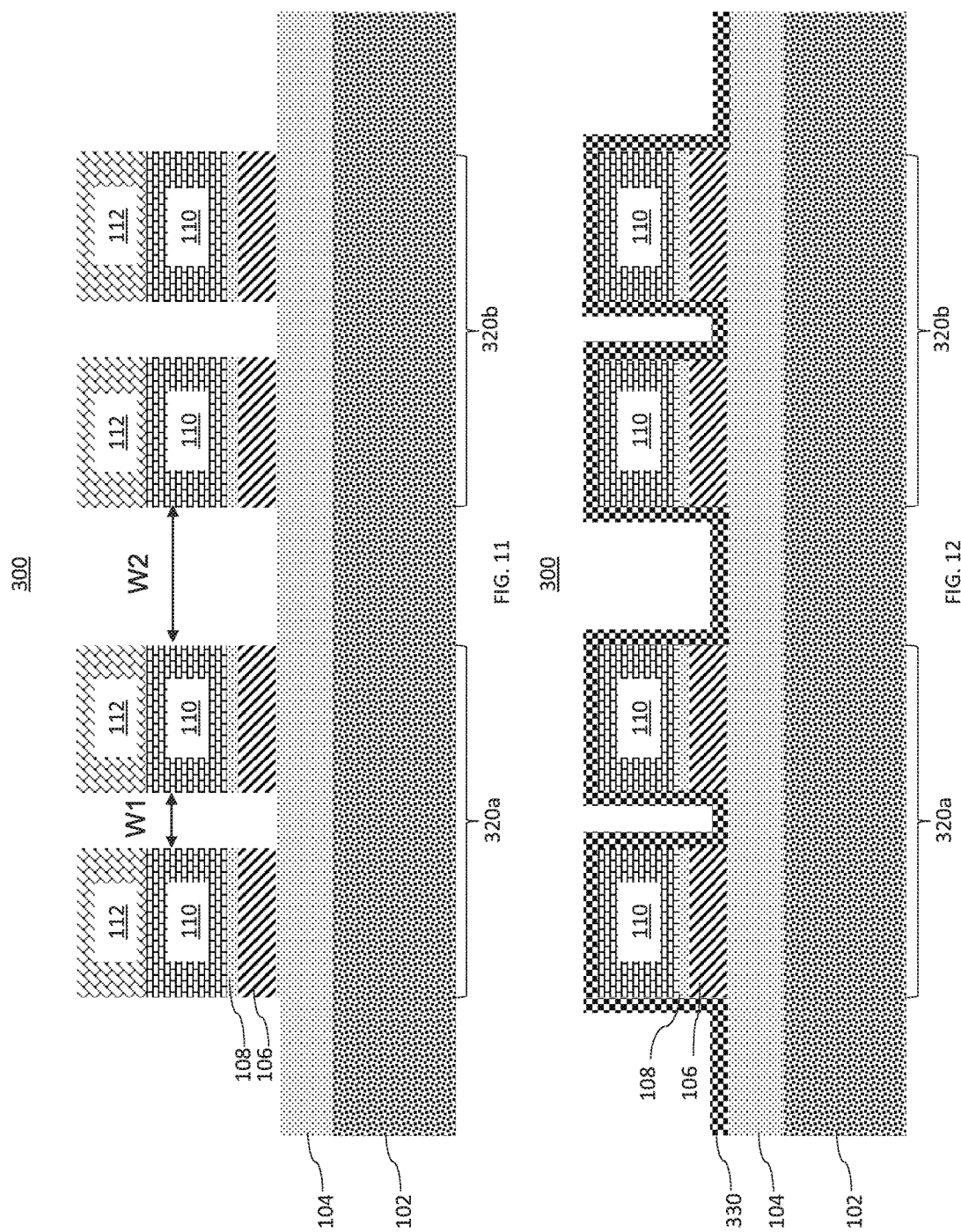

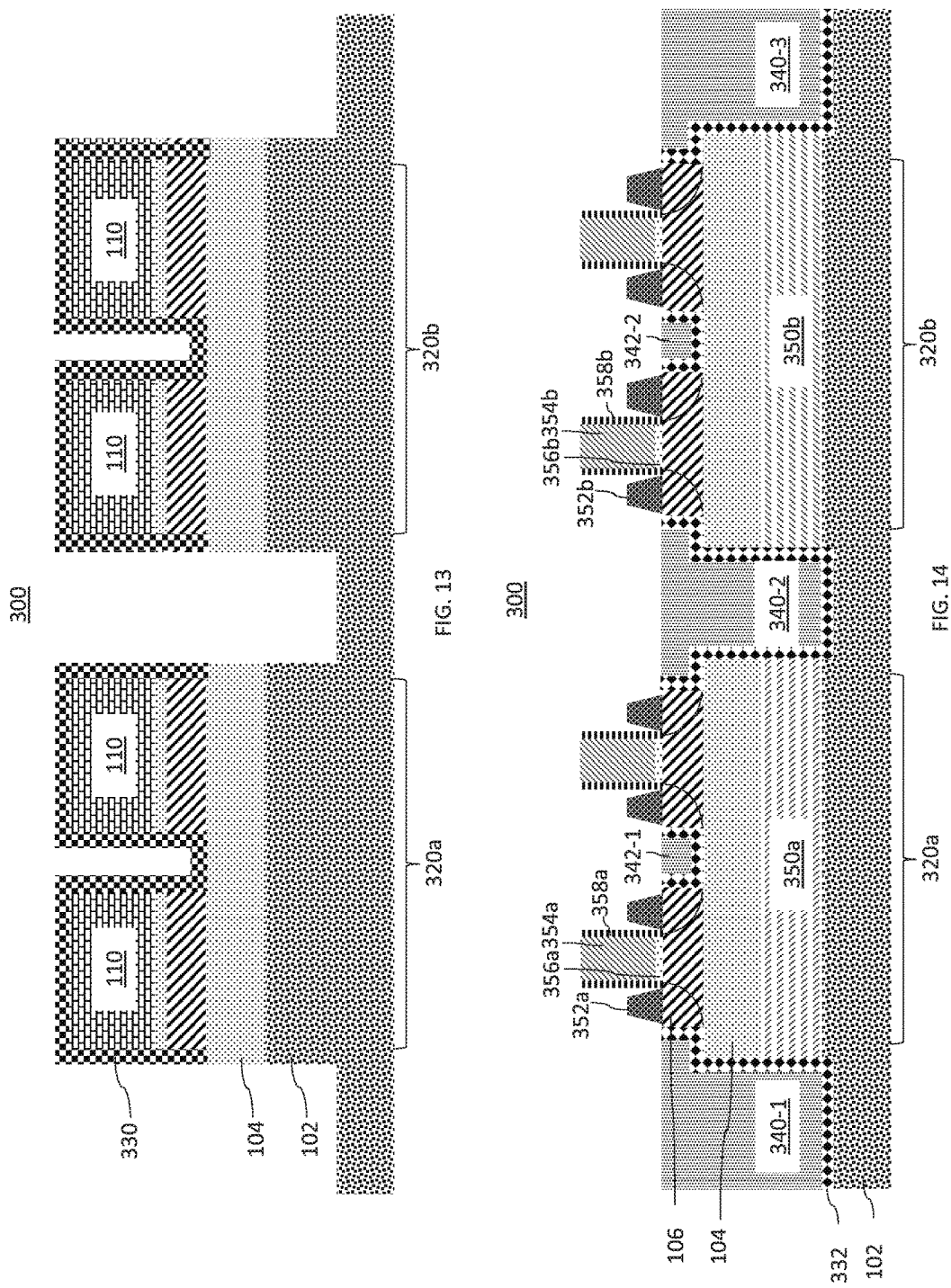

FORMATION OF SEMICONDUCTOR DEVICES WITH DUAL TRENCH ISOLATIONS

BACKGROUND

Technical Field

The present invention generally relates to semiconductor devices, and more particularly to semiconductor devices with dual trench isolations and methods of forming the same.

Description of the Related Art

A semiconductor on insulator (SOI) transistor (e.g., SOI field-effect transistor or FET) is a semiconductor device in which a semiconductor layer, such as, e.g., silicon (Si) or germanium (Ge), is formed on an insulator layer formed in a substrate (e.g., a buried oxide or BOX layer). The choice of the insulator material for the SOI substrate can depend on the particular application for the device. Examples of SOI transistors include partially depleted SOIs (PDSOIs) and fully depleted SOIs (FDSOIs). FDSOI technology has become a viable complementary metal-oxide-semiconductor (CMOS) technology. One advantage of FDSOI devices over other device architectures is threshold voltage (Vt) tunability by back gating.

SUMMARY

In accordance an embodiment of the present invention, a method for fabricating a semiconductor device with dual trench isolations is provided. The method includes forming a deep trench located between a first region associated with a first array of transistors and a second region associated with a second array of transistors, forming a first shallow trench located between transistors of the first array and a second shallow trench located between transistors of the second array, and forming, by a single dielectric material fill process, a deep trench isolation (DTI) region in the deep trench, a first shallow trench isolation (STI) region in the first shallow trench, and a second STI region in the second shallow trench.

In accordance with another embodiment of the present invention, a method for fabricating a semiconductor device with dual trench isolations is provided. The method includes forming a first pad dielectric layer on a semiconductor-on-insulator (SOI) substrate. The SOI substrate includes a base substrate, an insulator layer formed on the base substrate, and an SOI layer formed on the insulator layer. The method further includes forming a second pad dielectric layer on the first pad dielectric layer; patterning masks on the second pad dielectric layer, forming a deep trench located between a first region associated with a first array of transistors and a second region associated with a second array of transistors, forming a first shallow trench located between transistors of the first array and a second shallow trench located between transistors of the second array, and forming, by a single dielectric material fill process, a deep trench isolation (DTI) region in the deep trench, a first shallow trench isolation (STI) region in the first shallow trench, and a second STI region in the second shallow trench.

In accordance with yet another embodiment of the present invention, a semiconductor device with dual trench isolations is provided. The device includes a first device region formed on a base substrate, a second device region formed on the base substrate, and a deep trench isolation (DTI) region separating the first and second device regions. The first and second device regions each include a well, an insulator layer disposed on the well, semiconductor-on-insulator (SOI) layers disposed on the insulator layer, transistors disposed on respective ones of the SOI layers, and at least one shallow trench isolation (STI) region separating adjacent ones of the transistors.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 5 is a cross-sectional view of shallow trenches formed during the fabrication of the semiconductor device, in accordance with an embodiment of the present invention FIG. 6 is a cross-sectional view of deep trench isolation (DTI) regions and shallow trench isolation (STI) regions formed during the fabrication of the semiconductor device, in accordance with an embodiment of the present invention;

FIG. 9 is a cross-sectional view of STI regions formed during the fabrication of the semiconductor device, in accordance with another embodiment of the present invention;

FIG. 10 is a cross-sectional view of further device processing performed during the fabrication of the semiconductor device, in accordance with another embodiment of the present invention;

FIG. 11 is a cross-sectional view of STI regions formed during the fabrication of the semiconductor device, in accordance with yet another embodiment of the present invention;

FIG. 12 is a cross-sectional view of a dielectric liner formed during the fabrication of the semiconductor device, in accordance with yet another embodiment of the present invention;

FIG. 13 is a cross-sectional view of DTI regions formed during the fabrication of the semiconductor device, in accordance with yet another embodiment of the present invention; and FIG. 14 is a cross-sectional view of further device processing performed during the fabrication of the semiconductor device, in accordance with yet another embodiment of the present invention.

DETAILED DESCRIPTION

Figure 1:
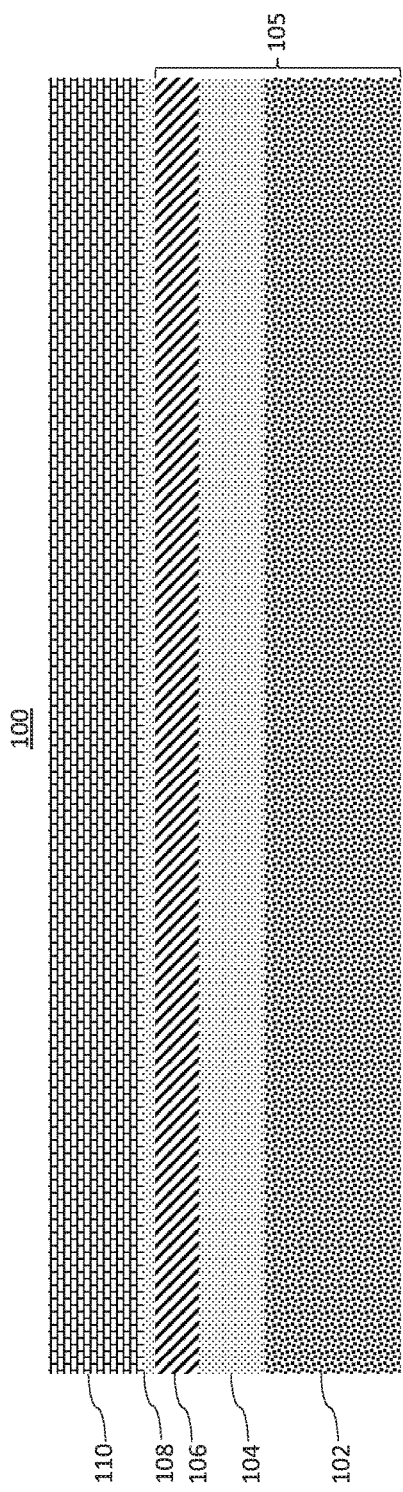
FIG. 1 is a cross-sectional view of pad dielectric layers formed on a semiconductor on insulator (SOI) substrate during the fabrication of a semiconductor device, in accordance with an embodiment of the present invention.

Aspects of the present embodiments provide for the formation of dual trench isolations in semiconductor-on-insulator (SOI) transistors, such as FDSOIs, in a self-aligned way, that form the deep trench isolation (DTI) regions and shallow trench isolation (STI) regions simultaneously during the same dielectric material fill process. Deep trench isolation (DTI) regions can be introduced to avoid leakage current between adjacent gates (doped regions below an insulator layer (e.g., buried oxide layer or BOX layer)). That is, DTI regions can be introduced through a SOI layer formed on the insulator layer, the insulator layer, and a back gate region into a base substrate of the SOI substrate. Further, shallow trench isolation (STI) regions in SOI layers can also be introduced above the insulator layer. The embodiments described herein reduce process complexity and cost by creating the DTI regions and the STI regions simultaneously, as opposed to separate process modules. Additionally, the simultaneous formation of the DTI and STI regions in accordance with the embodiments described herein can reduce or eliminate misalignment introduced between DTI region patterning and STI region patterning.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-14 depict respective steps of process flows for fabricating semiconductor devices with dual trench isolations. More specifically, FIGS. 1-8 depict respective steps of a process flow for fabricating a semiconductor device with dual trench isolations in accordance with one embodiment. FIGS. 9 and 10 depict respective steps of a process flow for fabricating a semiconductor device with dual trench isolations in accordance with another embodiment, and FIGS. 11-14 depict respective steps of a process flow for fabricating a semiconductor device with dual trench isolations in accordance with yet another embodiment.

Referring now to FIG. 1, a cross-sectional view is provided showing an exemplary semiconductor device 100 including a semiconductor on insulator (SOI) substrate 105. The SOI substrate 102 is shown including a base substrate 102, an insulator layer 104, and a semiconductor on insulator (SOI) layer 106.

In one example, the base substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

In one embodiment, the insulator layer 104 includes a buried oxide (BOX) layer. For example, the insulator layer 104 can include, e.g., silicon dioxide ($SiO_2$). However, any suitable material can be used to form the insulator layer 104 in accordance with the embodiments described herein.

The SOI layer 106 can include any suitable material in accordance with the embodiments described herein. For example, the SOI layer 106 can include, e.g., Si, Ge, etc.

One or more pad dielectric layers can be formed on the SOI layer 106. For example, as shown, a first pad dielectric layer 108 can be formed on the SOI layer 106, and a second pad dielectric layer 110 can be formed on the first pad dielectric layer 108. The first pad dielectric layer 108 can illustratively include an oxide material, and the second pad dielectric layer 110 can illustratively include a nitride material. However, any suitable materials can be used to form the one or more pad dielectric layers in accordance with the embodiments described herein.

Figure 2:
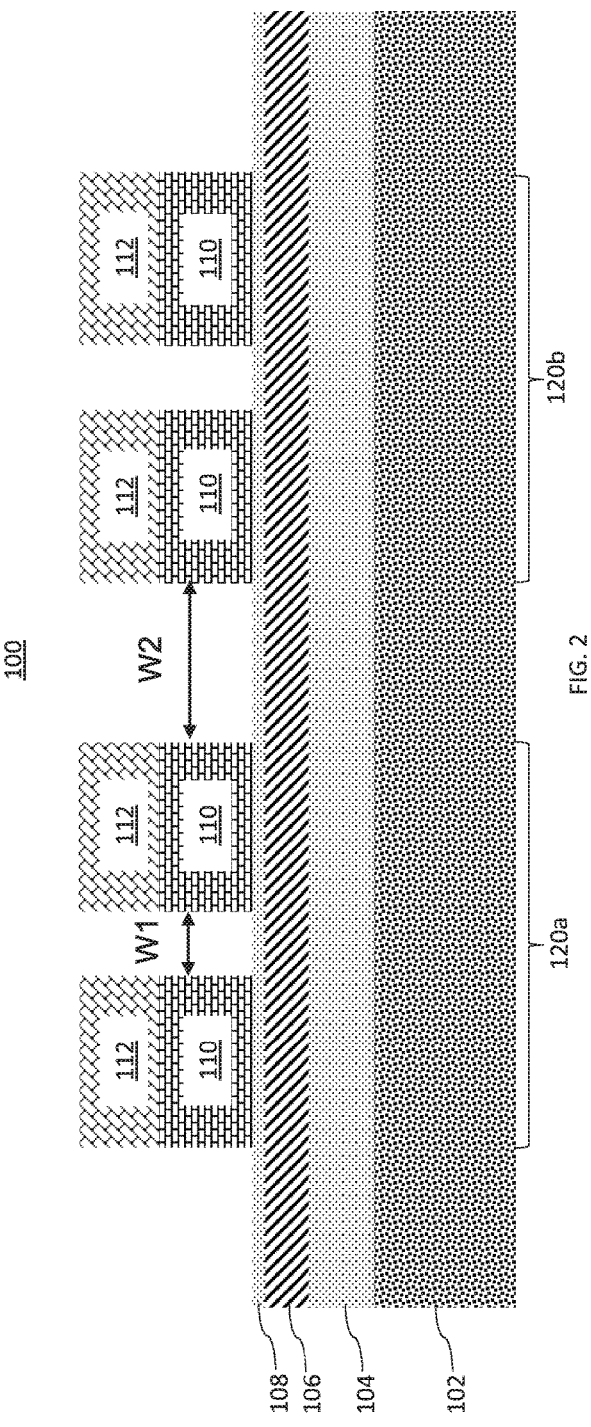
FIG. 2 is a cross-sectional view of material removed after mask patterning during the fabrication of the semiconductor device, in accordance with an embodiment of the present invention.

Referring to FIG. 2, masks 112 are formed on the second pad dielectric layer 110, and an etch process is performed to remove material up to the second pad dielectric layer 110. The mask 112 can include a hard mask and/or soft mask material, e.g., a nitride material, although any suitable material can be used in accordance with the embodiments described herein. Any suitable etch process can be used in accordance with the embodiments described herein (e.g., reactive-ion etching or RIE).

As shown, regions 120a and 120b are created by the etch process. Each of the regions 120a and 120b includes an array of structures separated by a distance W1. Further, regions 120a and 120b are separated by a distance W2. As will be described in further detail below, shallow trench isolation (STI) regions will be formed to separate the structures in each array (e.g., within the W1 distance), and deep trench isolation (DTI) regions will be formed to separate each of the regions 120a and 120b from one another.

Figure 3:
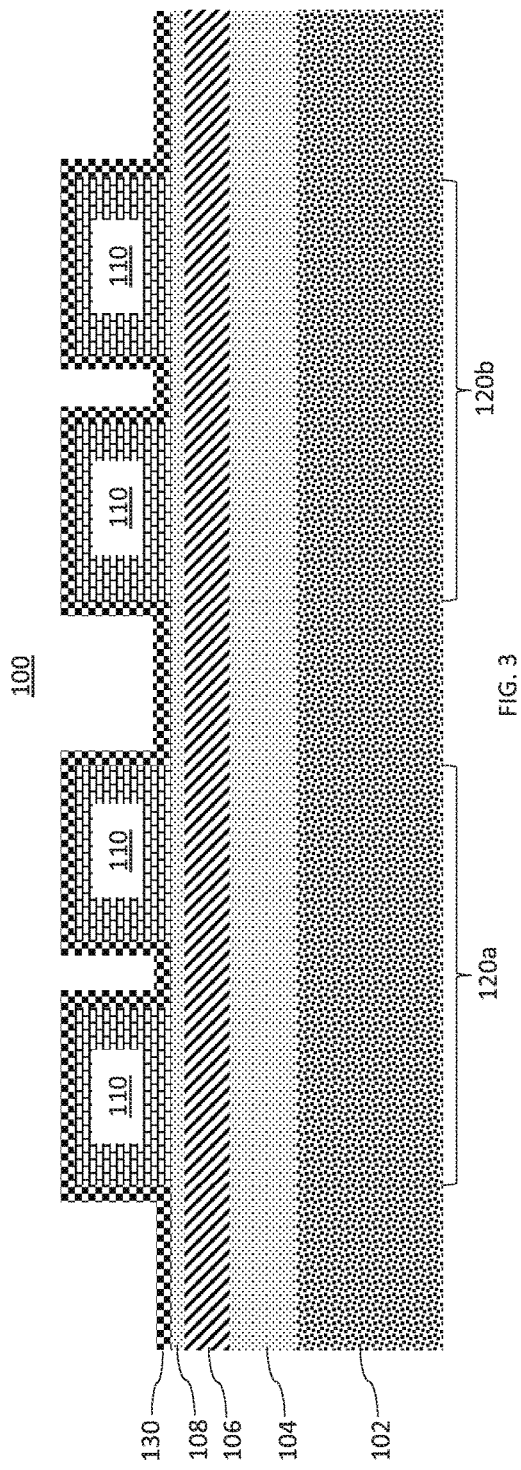
FIG. 3 is a cross-sectional view of a dielectric liner formed during the fabrication of the semiconductor device, in accordance with an embodiment of the present invention.

Referring to FIG. 3, the masks 112 are removed (e.g., stripped), and a dielectric liner 130 is formed. As shown, the dielectric liner 130 is conformally deposited along the exposed pad dielectric layers 108 and 110. The dielectric liner 130 can include any suitable dielectric material in accordance with the embodiments described herein. For example, the liner 130 can include a nitride material (e.g., silicon nitride or SiN).

Figure 4:
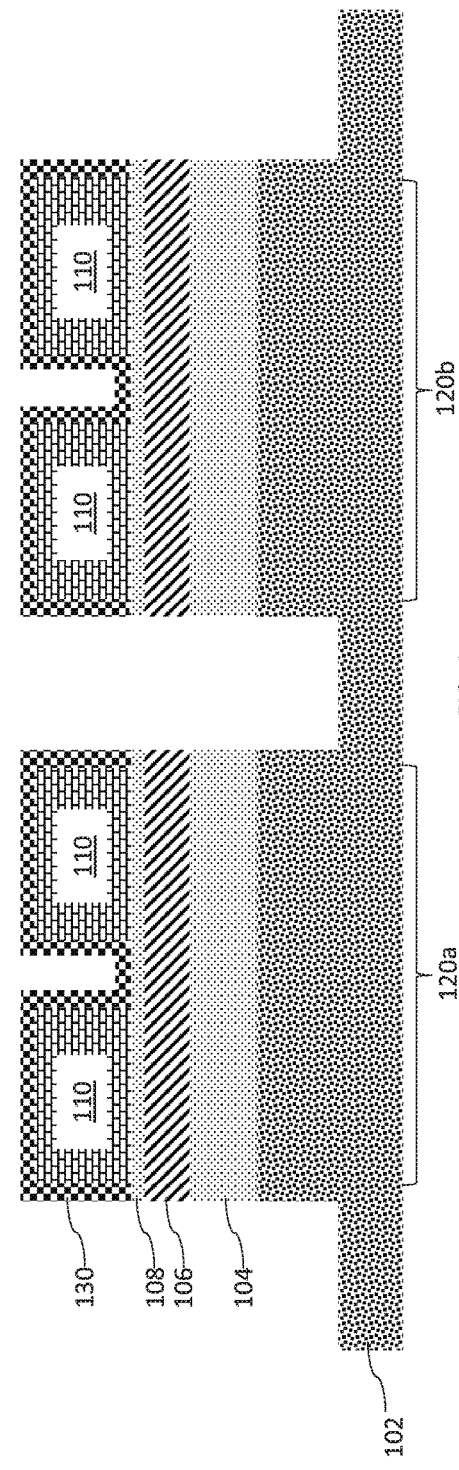
FIG. 4 is a cross-sectional view of deep trenches formed during the fabrication of the semiconductor device, in accordance with an embodiment of the present invention.

Referring to FIG. 4, an etch process is performed to create deep trenches. To accomplish this, portions of the dielectric liner 130 are removed from the bottoms of the trenches outside of the regions 120a and 120b so that the etch process can etch down to a depth within the base substrate 102. Any suitable etch process can be used in accordance with the embodiments described herein (e.g., directional RIE).

Referring to FIG. 5, an etch process is performed through the dielectric liner 130, the pad dielectric layers 110 and 108, and the SOI layer 106 to create shallow trenches separating the structures in the arrays. Any suitable etch process can be used in accordance with the embodiments described herein (e.g., directional RIE).

In another embodiment, as will be described in further detail with reference to FIGS. 9 and 10, the dielectric liner 130 can be removed prior to creating the shallow trenches.

In yet another embodiment, as will be described in further detail with reference to FIGS. 11-14, the shallow trenches can be formed prior to the formation of the dielectric liner 130 by removing material up to the insulator layer 104 after the masks 112 are formed.

Referring to FIG. 6, the dielectric liner 130 is removed and (optional) trench liner 132 is formed. As shown, the trench liner 132 is conformally deposited along the exposed surfaces of the device 100. The trench liner 132 can include any suitable dielectric material in accordance with the embodiments described herein. For example, the trench liner 132 can include an oxide, such as, e.g., $SiO_2$. Alternatively, the trench liner 132 can include a high-k dielectric material or a low-k dielectric material (e.g., a dielectric material having a dielectric constant greater than or less than that of $SiO_2$ at room temperature (e.g., from about 20° C. to about 25° C.) and atmospheric pressure (e.g., 1 atm).

As further shown, DTI regions 140-1 through 140-3 and STI regions 142-1 and 142-2 are formed. Forming the DTI regions 140-1 through 140-3 and the STI region 142-2 and 142-2 can include forming one or more dielectric materials to fill the trenches (e.g., on the trench liner 132). A planarization process (e.g., chemical-mechanical planarization or CMP) can be performed to remove excess dielectric material from the device 100 and to planarize the surfaces of the DTI regions 140-1 through 140-3 and the STI region 142-1 and 142-2. The one or more dielectric materials forming the DTI regions 140-1 through 140-3 and the STI regions 142-1 and 142-2 can include any suitable material(s) in accordance with the embodiments described herein. For example, the one or more dielectric materials can include an oxide (e.g., $SiO_2$). Accordingly, the DTI regions and the STI regions of the device 100 are simultaneously formed by a dual trench isolation process that utilizes a single dielectric material fill process.

Figure 7:
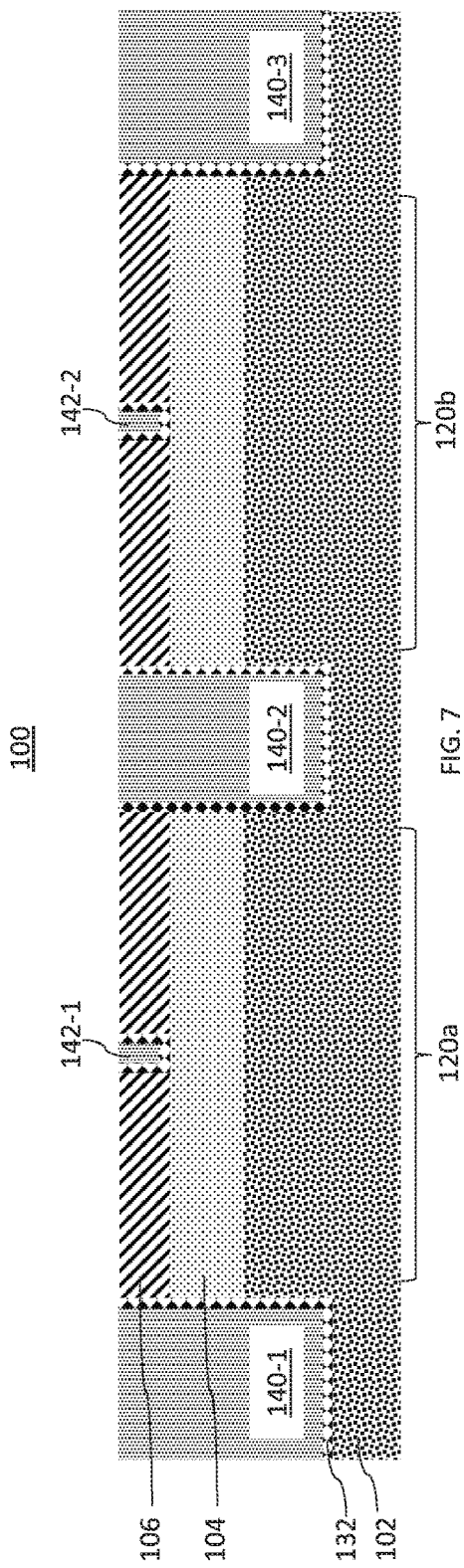
FIG. 7 is a cross-sectional view of material removed during the fabrication of the semiconductor device, in accordance with an embodiment of the present invention.

Referring to FIG. 7, the DTI regions 140-1 through 140-3 and the STI regions 142-1 and 142-2 are recessed, and material including the pad dielectric layers 108 and 110 are removed. Any suitable processes can be used in accordance with the embodiments described herein.

Figure 8:
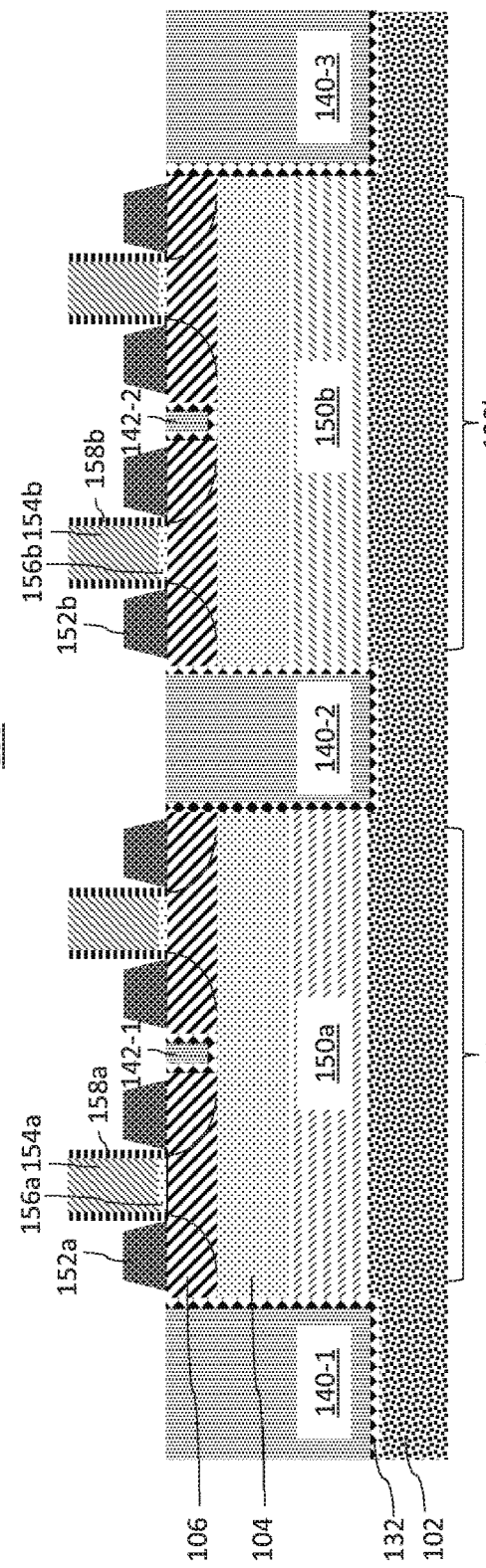
FIG. 8 is a cross-sectional view of further device processing performed during the fabrication of the semiconductor device, in accordance with an embodiment of the present invention.

Referring to FIG. 8, further processing is performed to fabricate the device 100. For example, a well 150a is formed in region 120a and a well 150b is formed in region 120b for back gate tuning. In one embodiment, the well 150a is of a first type and the well 150b is of a second type. For example, the well 150a can be an n-type well, or n-well, and the well 150b can be a p-type well, or p-well. The wells 150a and 150b can be formed using any suitable process in accordance with the embodiments described herein (e.g., ion implantation).

As further shown transistors are formed on each of the SOI layers 106 of each of the structures in the regions 120a and 120b. For example, as shown, a transistor including source/drain regions 152a, a gate structure including gate conductor 154a and gate dielectric 156a and a spacer layer 158a is formed in region 120a, and a transistor including source/drain regions 152b, a gate structure including gate conductor 154a and gate dielectric 156a and a spacer layer 158a is formed in region 120b.

Further downstream processing can be performed on the device 100.

As mentioned above in FIG. 5, in another embodiment, the dielectric liner 130 can be removed before creating the shallow trenches, which will now be described with reference to FIGS. 9 and 10. It is be assumed that semiconductor device 200 that will be described with reference to FIGS. 9 and 10 has had deep trenches created in accordance with FIG. 4.

Referring to FIG. 9, the dielectric liner 130 is removed after the deep trenches are formed, and then an etch process is performed through the pad dielectric layers 110 and 108, and the SOI layer 106 to create shallow trenches separating the structures in the arrays. Any suitable etch process can be used in accordance with the embodiments described herein (e.g., directional RIE). As shown, removing the dielectric liner 130 prior to performing the etch process to create the shallow trenches can cause the layers 106-110 to have rounded or sloping sidewalls (e.g., as a result of an isotropic etch process).

Referring to FIG. 10, further processing is performed to fabricate the device 200, similar to that described with reference to device 100 of FIGS. 6-8. For example, similar to the processes described with reference to FIGS. 6-8, (optional) trench liner 232 is formed, DTI regions 240-1 through 240-3 are and STI regions 242-1 and 242-2 are formed, the DTI regions 240-1 through 240-3 and the STI regions 242-1 and 242-2 are recessed, material including the pad dielectric layers 108 and 110 are removed, a well 250a is formed in region 220a and a well 250b is formed in region 220b, and transistors including a transistor having source/drain regions 252a, a gate structure including gate conductor 254a and gate dielectric 256a and a spacer layer 258a is formed in region 220a, and a transistor including source/drain regions 252b, a gate structure including gate conductor 254a and gate dielectric 256a and a spacer layer 258a is formed in region 220b.

Further downstream processing can be performed on the device 200.

As mentioned above in FIG. 5, in yet another embodiment, the shallow trenches can be created prior to creating the deep trenches, which will now be described with reference to FIGS. 11-14. It is assumed that semiconductor device 300 that will be described with reference to FIGS. 11-14 has had masks 112 formed on the second pad dielectric layer 110, as described with reference to FIG. 2.

Referring to FIG. 11, an etch process is performed to remove material up to the insulator layer 104, thereby creating regions 320a and 320b. Each of the regions 320a and 320b includes an array of structures separated by a distance W1 corresponding to the shallow trenches. Further, regions 320a and 320b are separated by a distance W2. As will be described in further detail below, DTI regions will be formed to separate each of the regions 320a and 320b from one another.

Referring to FIG. 12, the masks 112 are removed (e.g., stripped), and a dielectric liner 330 is formed. As shown, the dielectric liner 330 is conformally deposited along the exposed pad dielectric layers 108 and 110. The dielectric liner 330 can include any suitable dielectric material in accordance with the embodiments described herein (e.g., a similar material to that of the dielectric liner 130 formed with reference to FIG. 3).

Referring to FIG. 13, an etch process is performed to create deep trenches. To accomplish this, portions of the dielectric liner 330 are removed from the bottoms of the trenches outside of the regions 320a and 320b so that the etch process can etch down to a depth within the base substrate 102. Any suitable etch process can be used in accordance with the embodiments described herein (e.g., directional RIE).

Referring to FIG. 14, further processing is performed to fabricate the device 300. For example, similar to the processes described with reference to FIGS. 6-8, (optional) trench liner 332 is formed, DTI regions 340-1 through 340-3 are and STI regions 342-1 and 342-2 are formed, the DTI regions 340-1 through 340-3 and the STI regions 342-1 and 342-2 are recessed, material including the pad dielectric layers 108 and 110 are removed, a well 350a is formed in region 320a and a well 350b is formed in region 320b, and transistors including a transistor having source/drain regions 352a, a gate structure including gate conductor 354a and gate dielectric 356a and a spacer layer 358a is formed in region 320a, and a transistor including source/drain regions 352b, a gate structure including gate conductor 354a and gate dielectric 356a and a spacer layer 358a is formed in region 320b.

Further downstream processing can be performed on the device 300.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device with dual trench isolations, comprising:
   forming a deep trench located between a first region associated with a first array of transistors and a second region associated with a second array of transistors;
   forming a first shallow trench located between transistors within the first array and a second shallow trench located between transistors within the second array; and
   forming, by a single dielectric material fill process, a deep trench isolation (DTI) region in the deep trench, a first shallow trench isolation (STI) region in the first shallow trench, and a second STI region in the second shallow trench.

2. The method of claim 1, wherein the single dielectric material fill process includes forming dielectric material in the deep trench and the first and second shallow trenches, and planarizing the dielectric material.

3. The method of claim 1, further comprising forming a trench liner in the deep trench and the first and second trenches, wherein the DTI region and the first and second STI regions are formed on the trench liner.

4. The method of claim 1, further comprising:
   forming a first pad dielectric layer on a semiconductor-on-insulator (SOT) substrate, the SOT substrate including a base substrate, an insulator layer formed on the base substrate, and an SOI layer formed on the insulator layer;
   forming a second pad dielectric layer on the first pad dielectric layer; and
   patterning masks on the second pad dielectric layer.

5. The method of claim 4, wherein the first pad dielectric layer includes a pad oxide layer and the second pad dielectric layer includes a pad nitride layer.

6. The method of claim 4, further comprising:
   performing a first etch process to remove material up to the first pad dielectric layer;
   removing the masks;
   forming a dielectric liner on the first and second pad dielectric layers;
   performing a second etch process by removing material to a depth in the base substrate to form the deep trench;
   performing a third etch process by removing material up to the insulator layer to form the first and second shallow trenches; and
   removing the dielectric liner.

7. The method of claim 6, wherein the dielectric liner is removed prior performing the third etch process to form the first and second shallow trenches.

8. The method of claim 4, further comprising:
   performing a first etch process by removing material up to the insulator layer to form the first and second shallow trenches;
   removing the masks;
   forming a dielectric liner on the insulator layer, the SOI layer, and the first and second pad dielectric layers; and
   performing a second etch process by removing material to a depth in the base substrate to form the deep trench; and
   removing the dielectric liner.

9. The method of claim 4, further comprising recessing the DTI region and the first and second STI regions, and removing the first and second pad dielectric layers.

10. The method of claim 9, further comprising forming the first and second arrays of transistors.

11. The method of claim 10, further comprising forming a first well within the base substrate in the first region and a second well within the base substrate in the second region prior to forming the first and second arrays of transistors.

12. A method for fabricating a semiconductor device with dual trench isolations, comprising:
   forming a first pad dielectric layer on a semiconductor-on-insulator (SOI) substrate, the SOI substrate including a base substrate, an insulator layer formed on the base substrate, and an SOI layer formed on the insulator layer;
   forming a second pad dielectric layer on the first pad dielectric layer;
   patterning masks on the second pad dielectric layer;
   forming a deep trench located between a first region associated with a first array of transistors and a second region associated with a second array of transistors by removing material to a depth in the base substrate;
   forming a first shallow trench located between transistors within the first array and a second shallow trench located between transistors within the second array by removing material up to the insulator layer; and
   forming, by a single dielectric material fill process, a deep trench isolation (DTI) region in the deep trench, a first shallow trench isolation (STI) region in the first shallow trench, and a second STI region in the second shallow trench, the single dielectric material fill process including forming dielectric material in the deep trench and the first and second shallow trenches, and planarizing the dielectric material.

13. The method of claim 12, further comprising forming a trench liner in the deep trench and the first and second trenches, wherein the DTI region and the first and second STI regions are formed on the trench liner.

14. The method of claim 12, wherein the first pad dielectric layer includes a pad oxide layer and the second pad dielectric layer includes a pad nitride layer.

15. The method of claim 12, further comprising:
   performing a first etch process to remove material up to the first pad dielectric layer;
   removing the masks;
   forming a dielectric liner on the first and second pad dielectric layers;
   performing a second etch process to form the deep trench;
   performing a third etch process to form the first and second shallow trenches; and
   removing the dielectric liner.

16. The method of claim 15, wherein the dielectric liner is removed prior to forming the first and second shallow trenches.

17. The method of claim 12, further comprising:
   performing a first etch process to form the first and second shallow trenches;
   removing the masks;
   forming a dielectric liner on the insulator layer, the SOI layer, and the first and second pad dielectric layers; and
   performing a second etch process to form the deep trench; and
   removing the dielectric liner.

18. The method of claim 12, further comprising recessing the DTI region and the first and second STI regions, removing the first and second pad dielectric layers, and forming the first and second arrays of transistors.

19. The method of claim 18, further comprising forming a first well within the base substrate in the first region and a second well within the base substrate in the second region prior to forming the first and second arrays of transistors.

20. A semiconductor device with dual trench isolations, comprising:
    a first device region disposed on a base substrate;
    a second device region disposed on the base substrate; and
    a deep trench isolation (DTI) region separating the first and second device regions;
    the first and second device regions each including:
        a well;
        an insulator layer disposed on the well;
        semiconductor-on-insulator (SOI) layers disposed on the insulator layer;
        an array of transistors disposed on respective ones of the SOI layers; and
        at least one shallow trench isolation (STI) region separating adjacent ones of transistors within the array.

* * * * *